United States Patent
Kohdaka et al.

[19]

[11] Patent Number: 5,977,896
[45] Date of Patent: Nov. 2, 1999

[54] DIGITAL-TO-ANALOG CONVERTER WITH DELTA-SIGMA MODULATION

[75] Inventors: Takayuki Kohdaka; Mituhiro Homme; Masamitu Hirano; Tatsuya Kishii; Kuniaki Morita; Juhro Hoshi, all of Hamamatsu, Japan

[73] Assignee: Yamaha Corporation, Japan

[21] Appl. No.: 09/024,000

[22] Filed: Feb. 13, 1998

Related U.S. Application Data

[63] Continuation of application No. 08/024,782, Mar. 1, 1993, abandoned, which is a continuation of application No. 07/771,411, Oct. 2, 1991, abandoned.

[30] Foreign Application Priority Data

Oct. 3, 1990 [JP] Japan ..................................... 2-65869

[51] Int. Cl.$^6$ ...................................................... H03M 3/02
[52] U.S. Cl. .......................................... 341/143; 341/139
[58] Field of Search ................................. 341/139, 143, 341/144

[56] References Cited

U.S. PATENT DOCUMENTS 4,818,996  4/1989  Kimura ................................... 341/144
5,153,593  10/1992  Walden et al. ........................... 341/143

Primary Examiner—Marc S. Hoff
Attorney, Agent, or Firm—Adams & Wilks

[57] ABSTRACT

The digital-to-analog conversion apparatus operates to convert an digital input into a corresponding analog output. A digital filter is provided for oversampling the digital input having a varying value represented in the form of multiple bits. A delta-sigma modulator operates to effect delta-sigma modulation of the oversampled digital input to reduce a number of the multiple bits for requantizing the oversampled digital input with a certain S/N ratio. A low-pass filter is provided for converting the requantized digital input into an analog output. A level detecting circuit is provided for detecting when the value of the digital input falls below a predetermined level. A shifting circuit is disposed upstream of the delta-sigma modulator and is responsive to the detected results for increasing the value of the digital input so as to improve the S/N ratio in the delta-sigma modulator. An attenuator is disposed downstream of the delta-sigma modulator and is responsive to the detected results for effecting decreasing compensation for the increased value of the digital input while substantially maintaining the improved S/N ratio so as to produce an analog output corresponding to the digital input.

18 Claims, 7 Drawing Sheets

5,977,896

DIGITAL-TO-ANALOG CONVERTER WITH DELTA-SIGMA MODULATION

This application is a continuation of Ser. No. 08/024,782 filed Mar. 1, 1993, now abandoned, which is a continuation of Ser. No. 07/771,411 filed Oct. 2, 1991, now abandoned.

BACKGROUND OF THE INVENTION

The present invention relates to digital-to-analog conversion apparatuses or DA conversion apparatuses utilizing oversampling technology and noise shaping technology based on delta-sigma modulation.

FIG. 2 shows an example of the conventional DA conversion apparatus utilizing the combination of oversampling technology and noise shaping technology. In FIG. 2, the DA conversion apparatus is comprised of a digital filter 10 for oversampling a digital input DI having a varying value represented by multiple bits to feed an oversampled digital signal A, a delta-sigma modulator 12 for effecting delta-sigma modulation, i.e., differentiation/integration processing of the oversampled digital signal A to produce a modulated signal B having a requantized value represented by less number of bits, a waveform shaper 14 for waveform-shaping pulses of the modulated or requantized signal B in synchronization with a clock signal to produce a shaped pulse signal C, a clock generator 16 for generating a system clock signal $\phi$s having a given frequency fs, and a low-pass filter or LPF 18 for filtering the pulse signal C to convert the same into an analog output AO corresponding to the digital input DI.

A circuit portion enclosed by the dot-and-chain line IC is composed of an integrated circuit of the monolithic or hybrid construction disposed in a single package, while a quartz resonator 16A is externally coupled to the clock generator 16 as an oscillating source. Otherwise, the digital filter 10 and its associated parts enclosed by the broken line may be incorporated into the same integrated circuit.

The digital input DI is given in the form of a digital waveform containing, for example, a sample sequence of digital data each composed of 16 bits, i.e., one word, and being fed to the digital filter 10 at, for example, 44.1 KHz a relatively slow data transfer rate. The system clock signal $\phi$s has, for example, 16.9 MHz relatively fast frequency fs. Normally, the oversampled digital signal A is fed from the digital filter 10 to the delta-sigma modulator 12 at, for example, 8.45 MHz (fs/2) of fast data transfer rate.

The delta-sigma modulator 12 is provided to reduce an oversampling frequency or rate in the oversampling operation of the digital filter 10. Generally, the higher the oversampling rate, the better the filtering performance of the digital filter. However, the increase of oversampling rate may adversely affect the overall performance of the DA converter. In view of this, the delta-sigma modulator is utilized to noise-shape the oversampled digital signal to thereby reduce efficiently an oversampling rate. Therefore, the delta-sigma modultor is called a noise shaper. The delta-sigma modulator may be of single or double loop type constructed such as to produce the modulated or noise-shaped signal B in the form of a pulse-density-modulated signal or a bit stream signal. Otherwise, the delta-sigma modulator 12 may be of triple or more loop type constructed such as to produce a pulse-width-modulated signal B.

The delta-sigma modulator 12 operates to convert or requantize a multi-bit digital signal to a lesser-bit digital signal having a lesser number of bits. Such conversion may cause a quantization error which is distributed significantly to a relatively high frequency range. Namely, FIG. 3 indicates a power spectrum of an ideal output of the delta-sigma modulator 12. A noise power due to the quantization error becomes maximum in a high frequency range at the vicinity of fs/2. This power spectrum may contain a sharp line spectrum component Pa at a relatively low frequency range when an inputted digital signal is given in the form of a sine wave. Another spectrum component Pb is generated due to the system clock signal $\phi$s having the frequency fs.

The requantized signal B regularly contains various noise components due to fluctuation or distortion during digital processing, over the ideal power spectrum. Therefore, if the requantized signal B were directly converted into an analog output, there would be caused a considerable conversion error due to the noise components. In view of this, the waveform shaper 14 is interposed to waveform-shape the modulated signal B based on the system clock signal $\phi$s to thereby feed the waveform-shaped pulse signal C to the LPF18 in order to reduce DA conversion error due to noise components.

In the above noted conventional DA conversion apparatus, an oversampling ratio is determined in terms of fo/fi where fi denotes an input frequency or an input rate of the digital input DI to the digital filter 10, and fo denotes an output frequency of the modulated signal B from the delta-sigma modulator 12. Generally, the greater the oversampling ratio, the greater the S/N ratio. FIG. 4 shows an example of such relation between the oversampling ratio and the S/N ratio, where a requantization bit number is set to 2 and the loop number K is set to 1–4 in the delta-sigma modulator 12. As understood from the FIG. 4 graph, the oversampling ratio might be set as great as possible in order to obtain a practically good S/N ratio. For example, in order to obtain 120 dB of S/N ratio with using a double loop (K=2) type of the delta-sigma modulator, the oversampling ratio should be set in the order of 400 as seen from the FIG. 4 graph. If an initial sampling of the original digital input DI is carried out at the sampling rate of 50 KHz, the delta-sigma modulating operation should be carried out at the rate of 20 MHz to realize the desired oversampling ratio of 400 so that the system clock frequency fs is set to 20 MHz in the D/A conversion apparatus or system. In order to drive the system at such high frequency or speed, the various circuit components 10, 12, 14, 16 and so on must have considerably high speed performance, and further a shielding construction may be needed to avoid radio trouble due to subsidiary radiation, thereby causing drawbacks such as complicated construction and cost increase.

SUMMARY OF THE INVENTION

An object of the present invention is to reduce the oversampling ratio while maintaining a practically high S/N ratio in the DA conversion apparatus of the oversampling type. In order to achieve the object, the inventive DA conversion apparatus of the oversampling type is characterized by detecting means for detecting when a varying value of the digital input falls below a predetermined level at an upstream of the digital filter or the delta-sigma modulator so as to generate a detection signal, input increasing means responsive to the detection signal for increasing the value of the digital input by a given factor, and output decreasing means responsive also to the detection signal for decreasing the value of an analog output so as to effectively cancel the increased amount of the digital input.

In operation of the inventive construction, when there is provided a relatively low level of digital input less than a predetermined value, such low level digital input is once increased or boosted by a sufficient amount and is then subjected to the delta-sigma modulating operation to thereby improve the S/N ratio. Thereafter, an analog output is decreased with a respect to both the signal and noise components so as to cancel the increased amount of the digital input to thereby produce a final true analog output corresponding exactly to the original digital input while reserving the improved S/N ratio. By such operation, the S/N ratio can be improved independently from the oversampling ratio, thereby achieving a higher S/N ratio with a lower oversampling ratio as compared to the prior art.

DETAILED DESCRIPTION OF THE INVENTION

Figure 1:
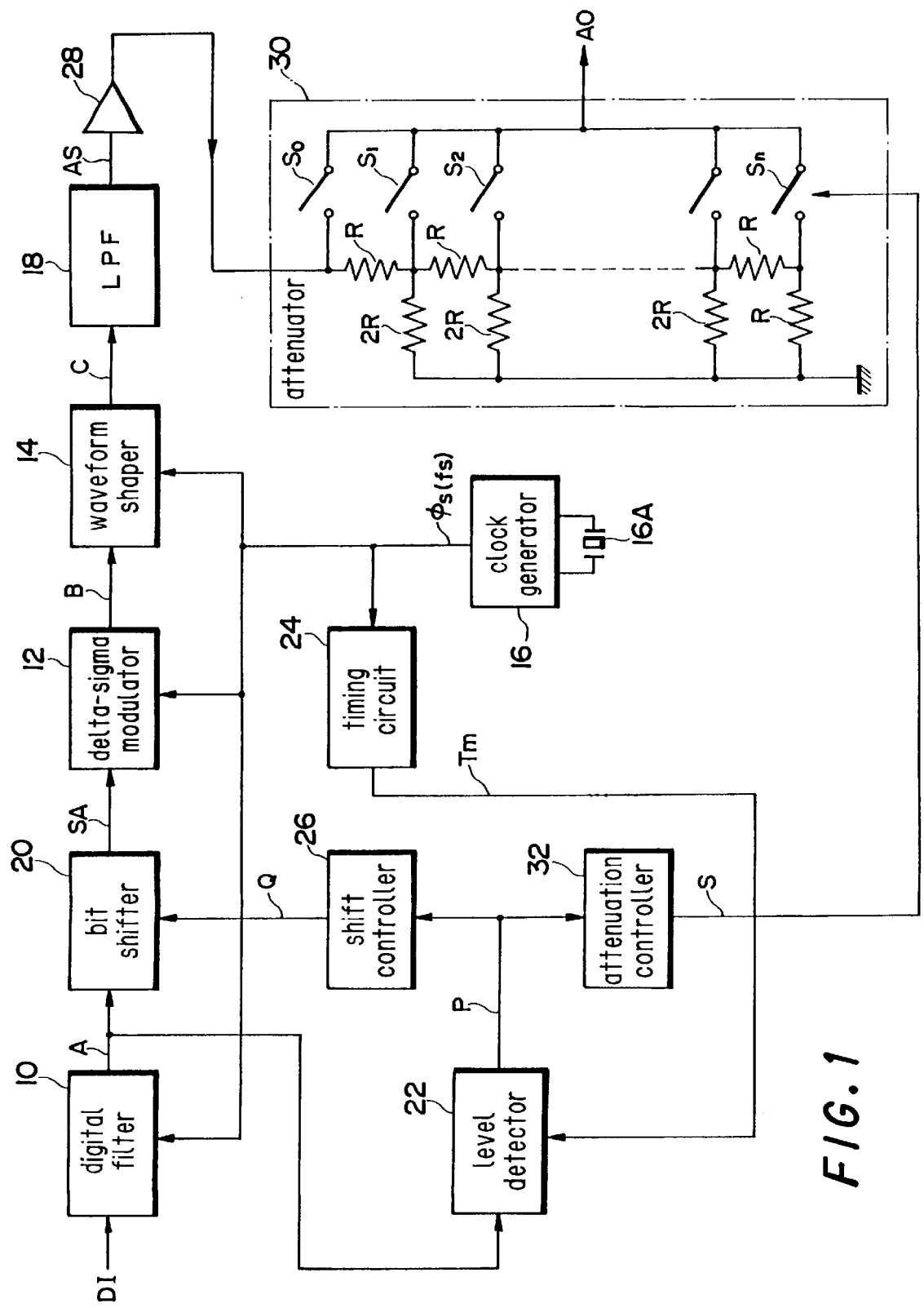
FIG. 1 is a block diagram showing an embodiment of the inventive DA conversion apparatus.
Figure 2:
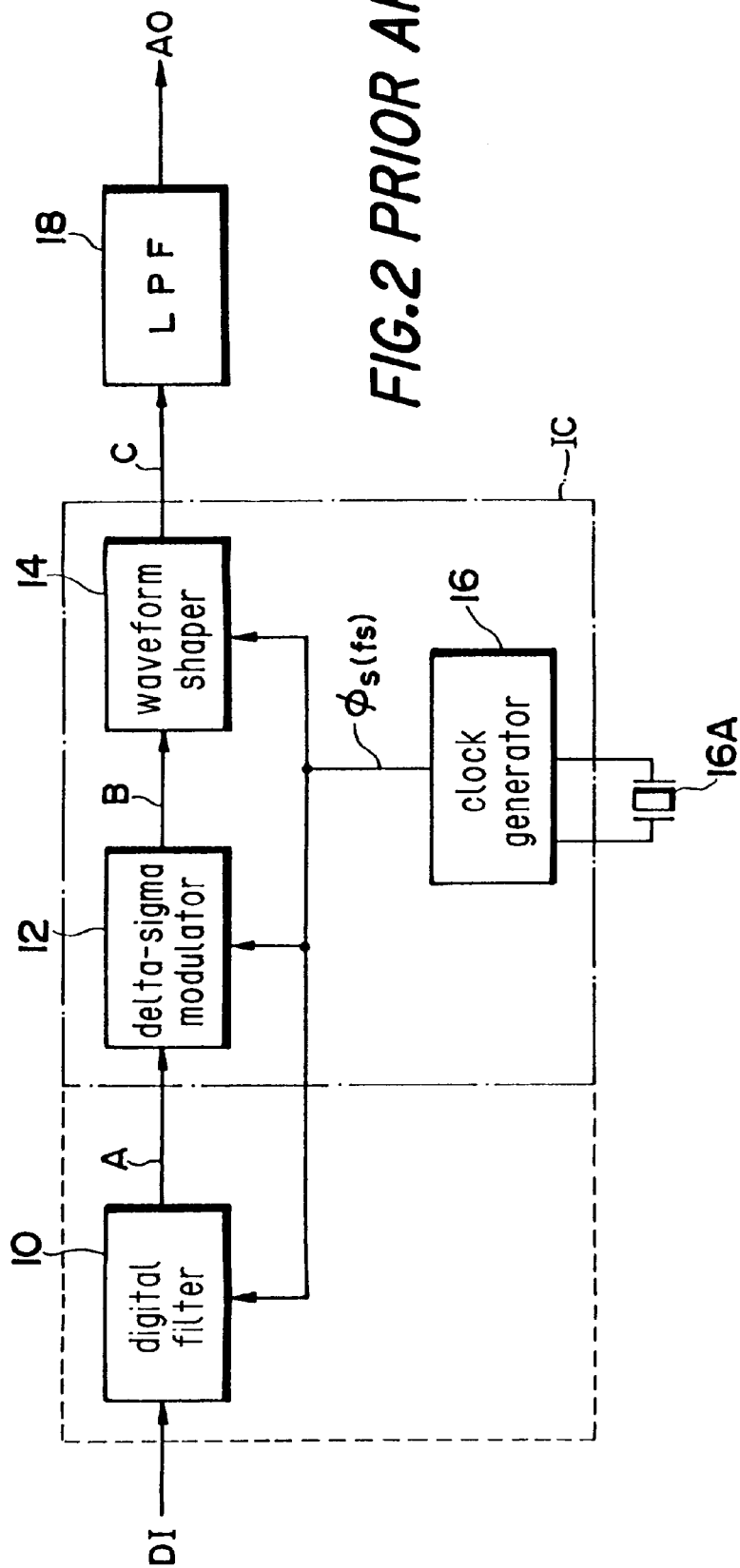
FIG. 2 is a block diagram showing an example of the conventional DA conversion apparatus.
Figure 3:
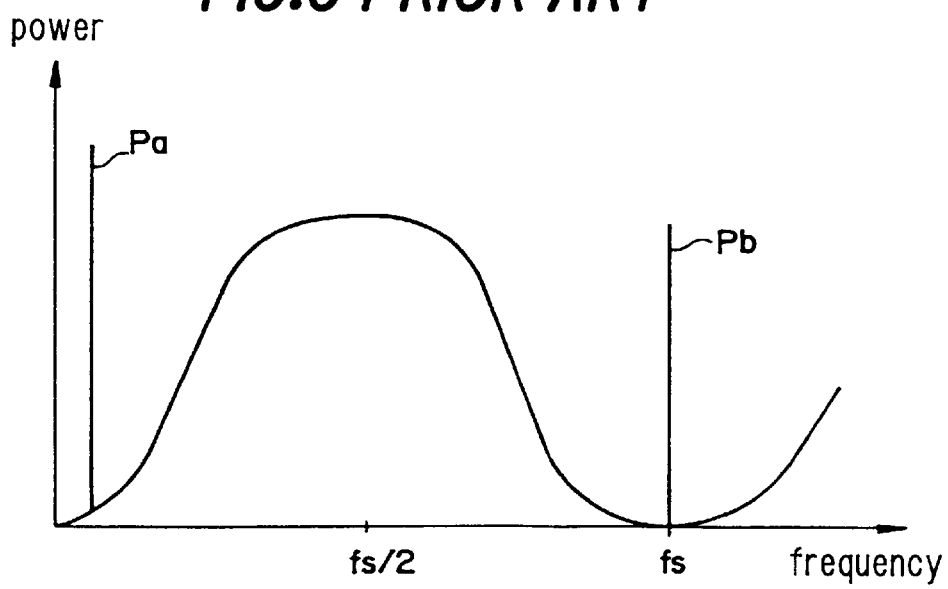
FIG. 3 is a graph showing a general power spectrum output of a delta-sigma modulator.
Figure 4:
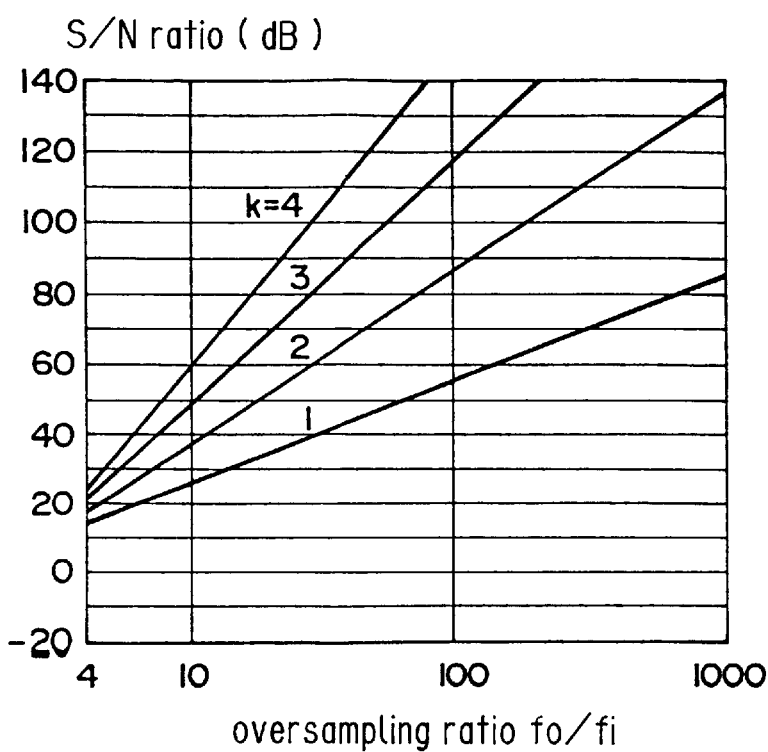
FIG. 4 is a graph showing the dependency of S/N ratio on oversampling ratio fo/fi.

FIG. 1 shows a circuit construction of an embodiment of the oversampling type DA conversion apparatus. In the figure, the like parts are denoted by the like reference numerals as in the FIG. 2 prior art to facilitate the understanding of the invention. Namely, in similar manner to the prior art, the inventive apparatus is provided with a digital filter 10 for oversampling at a given high oversampling rate a digital input DI having a sample sequence of varying digital values each comprised of multiple bits to feed an oversampled digital signal A, a delta-sigma modulator 12 for effecting delta-sigma modulation, i.e., diferentiation/integration processing of the oversampled digital signal A to feed a modulated or requantized signal B having a requantized digital value represented by less numbers of bits, a waveform shaper 14 for waveform-shaping pulses of the requantized signal B in synchronization with a shaping clock signal to produce a shaped pulse signal C, a low-pass filter or LPF 18 for filtering the pulse signal C to convert the same into an analog signal AS, and a clock generator 16 provided with a quartz resonator 16A for generating a system clock signal φs having a given frequency fs.

In such construction, characterizingly a bit shifter 20 is connected to an output terminal of the digital filter 10, operative to selectively effect leftward bit-shifting of the oversampled digital signal A having a multi-bit value each oversampling timing to produce a selectively bit-shifted signal SA which is then fed to the succeeding delta-sigma modulator 12. There is further provided a level detector 22 responsive to a timing signal Tm fed from a timing circuit 24 and produced by frequency-dividing the system clock signal φs for detecting whether the digital value of the oversampled signal A falls below a predetermined level every sampling timing. The level detector 22 operates when the detection result is negative to produce a detection signal P of value "0", and operates when the detection result is positive to produce a detection signal P of value "1". The predetermined level used as a reference can be set according to a noise level contained in the digital input.

A shift controller 26 is connected between the bit shifter 20 and the level detector 22 for feeding a shift bit designation signal Q to the bit shifter 20 according to the detection signal P. The shift controller 26 operates when the detection signal P indicates "0" for producing the designation signal Q indicative of an ineffective null shift amount, while it operates when the detection signal P indicates "1" for producing the designation signal Q indicative of an effective shift amount in the form of a given shift bit number. The bit shifter 20 operates when receiving the designation signal Q indicative of the ineffective null shift amount for transferring the inputted digital signal A as it is without bit-shifting to thereby output the identical digital signal SA. On the other hand, the bit shifter 20 operates when receiving the designation signal Q indicative of, for example, two-bit shift for shifting an oversampled multi-bit digital value of the signal A leftward by two bits to thereby output the signal SA having a magnitude or value four times as great as the corresponding signal A. Thus, the bit shifter 20 and the shift controller 26 constitute means for increasing a value of the digital input when its level is below the predetermined level to produce a selectively increased digital input which is to be processed by the subsequent delta-sigma modulator 12 with an improved S/N ratio.

On the other hand, an attenuator 30 is connected through a buffer 28 to an output terminal of the LPF 18 for receiving therefrom an analog signal AS. This attenuator 30 performs attenuation of the analog signal AS, controllably by an attenuation controller 32 according to the detection signal P fed from the level detector 22. The attenuator 30 is comprised of a ladder resistance network of the R-2R connection type and selection switches S0, S1, . . . Sn, each being connected between an output terminal of the attenuator 30 and respective one of junction points of the series-connected resistors R. When a particular one of the selection switches Si (i=0, 1, . . . , n) is selectively turned on, the attenuator 30 outputs the attenuated analog output AO represented by $AO=AS/2^i$.

The attenuation controller 32 is responsive to the detection signal P for producing a control signal S effective to selectively turn on the switch S0 when the detection signal P indicates "0", and effective to turn on a predetermined particular one of the selection switches Si to cancel or compensate for the increased amount or shift amount of the digital signal SA when the detection signal P indicates "1". For example, when the shift amount is set to two bits, i.e., the increased amount of multiplier factor is set to $2^2=4$, the attenuation controller 32 operates in response to the detection signal P="1" to produce the control signals effective to selectively turn on the switch S2 so as to reduce the level of the increased analog signal AS as well as its noise level by the fractional attenuation rate of $½^2=¼$. Therefore, the attenuator 30 and the attenuation controller 32 constitute means for selectively decreasing the increased analog signal AS to produce the final analog output AO having an analog value substantially exactly corresponding to a digital value of the initial digital input DI, while maintaining the S/N ratio improved through the bit shifter 20 because both the signal and noise components are concurrently reduced by the rate of ¼ in the attenutor 30.

Figure 8:
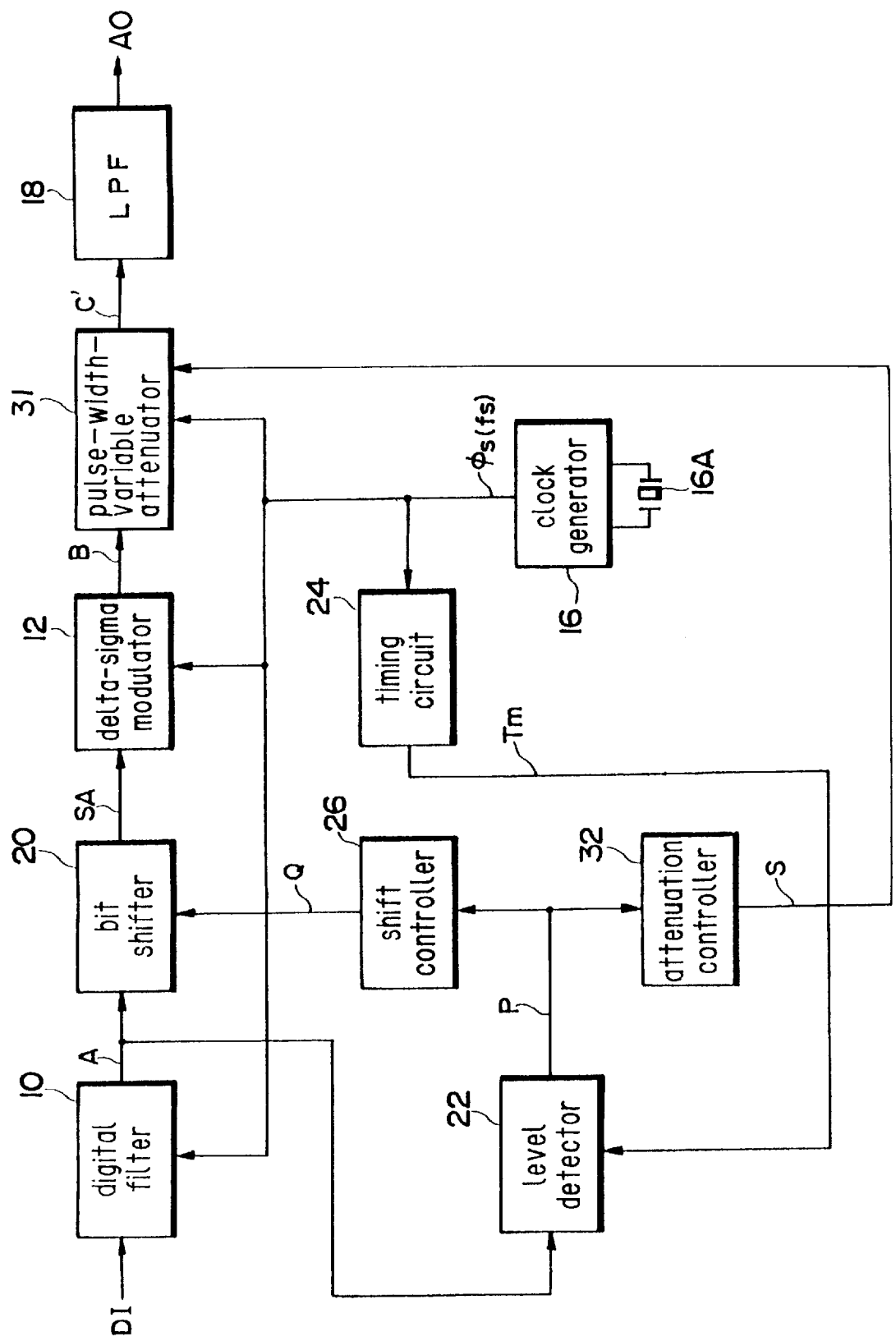
FIG. 8 is a block diagram showing another embodiment of the inventive DA conversion apparatus.

FIG. 8 shows another embodiment of the present invention. In the FIG. 1 embodiment, the analog signal AS from the LPF 18 is inputted through the buffer 28 into the attenuator 30 so as to attenuate the analog signal AS. Alternatively in this FIG. 8 embodiment. a pulse-width-variable attenuator 31 is connected to the delta-sigma modulator 12 to receive the requantized signal B for producing a corresponding pulse signal C' having a variable pulse width which is set inversely of the multiplier factor.

Figure 9A:
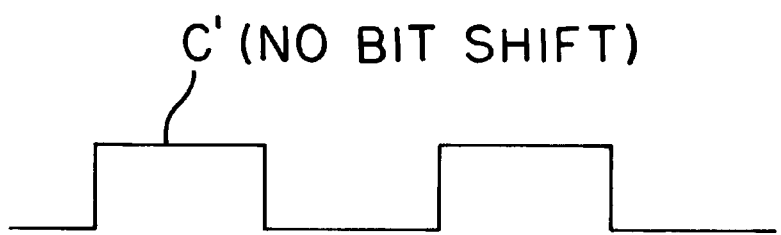
FIGS. 9A–9C are waveform diagrams showing the operation of the FIG. 8 embodiment.
Figure 9B:
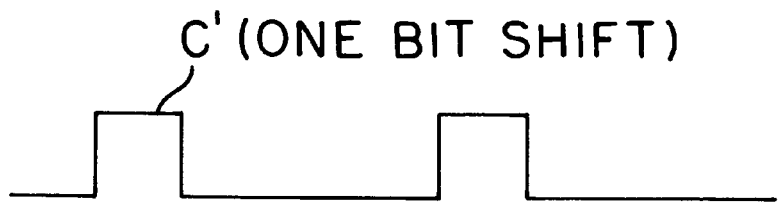
Figure 9C:
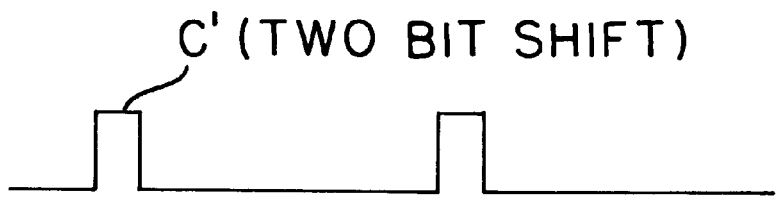

In operation, as shown in FIGS. 9A–9C, the variable pulse width of the attenuator 31 is set or controlled according to the control signal S fed from the attenuation controller 32 so as to cancel out the multiplying bit shift applied to the digital signal A. Namely, in case that the digital signals is not bit-shifter through the bit shiftered, the attenuator 31 produces the pulse signal C' having a regular pulse width as shown in FIG. 9A. When the digital signal A is shifted leftward by one bit through the bit shifter 20, the attenuator 31 produces accordingly the pulse signal C' having a narrow pulse width reduced by half as compared to the regular pulse width, as indicated by FIG. 9B. Further, when the bit shifter 20 effects multiplying two bit shift, the attenuator 31 accordingly produces the pulse signal C' having a further narrow pulse width reduced by one-fourth as compared to the regular pulse width, as indicated by FIG. 9C. As describe the compensative attenuation can be effected by the pulse-width-modulation technology. In this embodiment, the attenuation operation is carried out before the LPF 18 to thereby simplify circuit design of the DA converter.

It should be recognized that the present invention is not limited to the above described embodiments but may include various modifications. These modifications include the following alternative expedients:

1. Instead of the bit shifter 20 and shift controller 26, the input increasing means can be composed of a digital multiplying unit operative to multiply the digital signal A by a given factor to produce a multiplied digital signal SA.
2. Instead of the buffer 28, attenuator 30 and attenuation controller 32, the output decreasing means can be composed of an analog multiplying unit operative to multiply the intermediate analog signal AS by a given fraction factor to produce the final analog output.
3. The level detector 22 can be modified to gradatively detect the value of the digital input with using gradated detection levels in order to differently set a bit shift amount and a compensative attenuation rate according to the gradation. Namely, the modified level detector operates to produce a gradated detection signal P effective to set three or more grades of the shift control signal Q and the attenuation control signal S proportionally to the detected level of the digital signal A.
4. The input increasing means is generally disposed in an upstream of the delta-sigma modulator 12. Therefore, alternatively the bit shifter 20 can be provided before the digital filter 10, while concurrently a level detection of the digital input DI can be carried out at an input side of the bit shifter 20.
5. The output decreasing means is generally disposed in a downstream of the waveform shaper 14. Therefore, the buffer circuit 28 and attenuator 30 can be interposed between the waveform shaper 14 and the LPF18 as one alternative of the FIG. 1 embodiment.
6. The inventive concept is applied to sequential processing of sampled digital input in the above described embodiment. However, the inventive concept can be expanded to another type of digital input representative of a digital waveform such as a digital sine waveform. Namely, when an input level or amplitude of the digital sine waveform is smaller than a predetermined level, the digital waveform input representative of the sine wave is leftward bit-shifted to increase the same, while the corresponding analog waveform output is decreased by the analog attenuator.

As described above, according to the invention, when it is detected that a value of the digital input fed to the delta-sigma modulator through the digital filter is below a predetermined level, the digital input is increased by a given amount, while a corresponding analog output is decreased inversely to the given amount, so as to improve the S/N ratio of the digital input. By such construction, the oversampling ratio can be effectively reduced while maintaining the S/N ratio to thereby advantageously realize the DA conversion apparatus of the oversampling type having a simplified structure and a reduced production cost.

Figure 5:
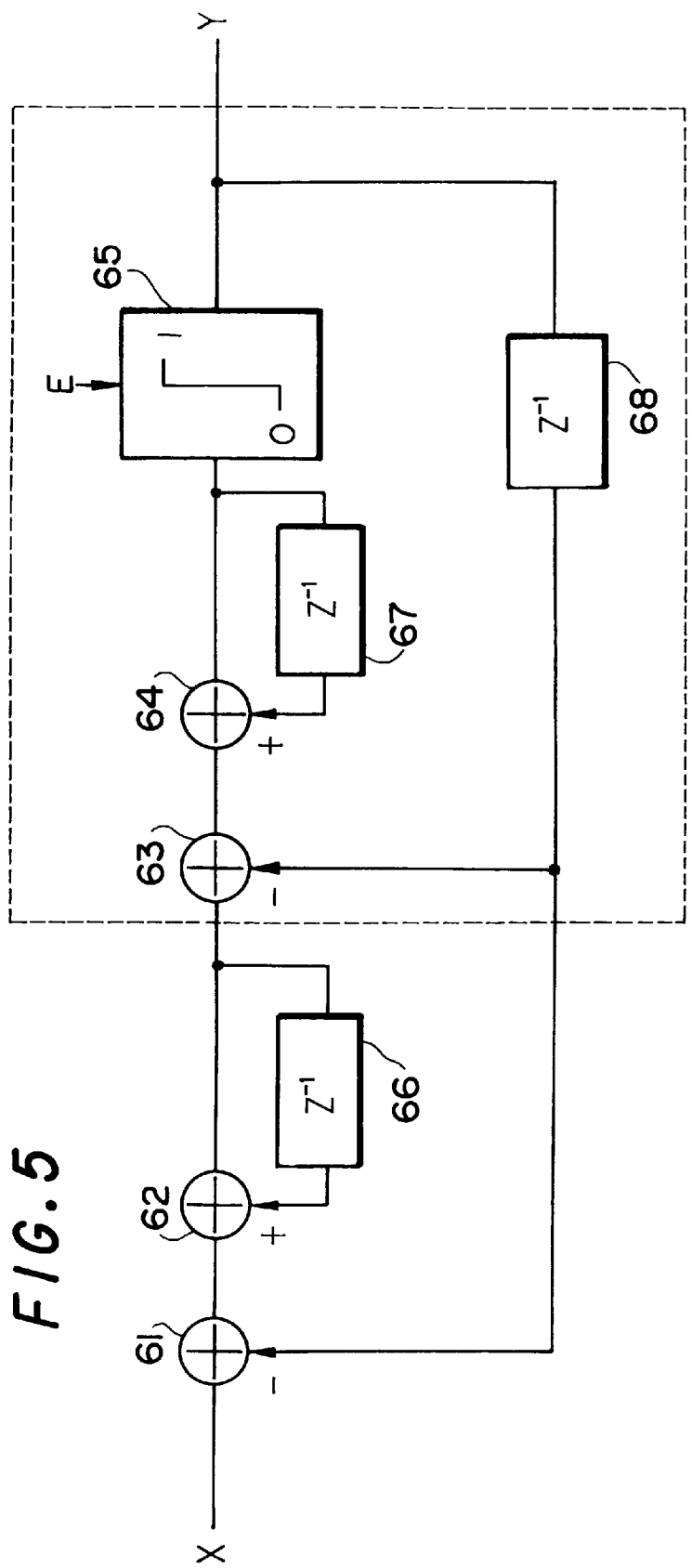
FIG. 5 is a circuit diagram showing an example of the delta-sigma modulator used in the FIG. 1 embodiment.

Additionally, FIG. 5 shows an example of the delta-sigma modulator 12 provided in the FIG. 1 DA conversion apparatus. The FIG. 5 modulator is constructed of a double loop type which includes a basic part of a single loop enclosed by the dashed line and comprised of adders 63 and 64, delay elements 67 and 68, and differentiator 65. The basic part has input/out performance represented by:

$$Y=X+(1-Z^{-1})E$$

where $Z^{-1}$ denotes delay function to delay a data by one sampling time and E denotes a quantization error.

Figure 6:
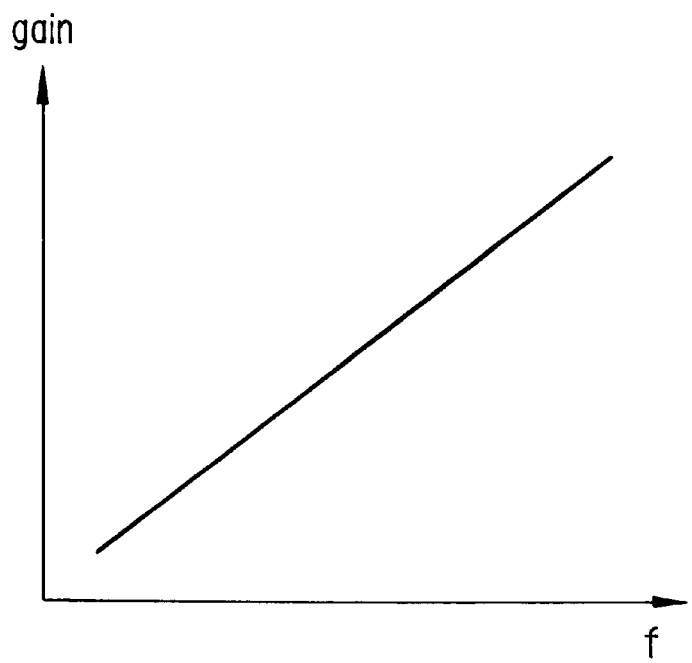
FIGS. 6 and 7 are graphs showing performance of the FIG. 5 delta-sigma modulator.

The differentiator 65 operates as a one bit quantizer to discriminate as to whether an input data is positive or negative so as to output a binarily quantized data 0 or 1 according to the discrimination results. As shown in FIG. 6, the differentiator 65 has a gain which steadily increases in terms of frequency. The differentiator 65 generates a quantization error E in its output. This quantization error E is significantly distributed in higher frequency range.

Figure 7:
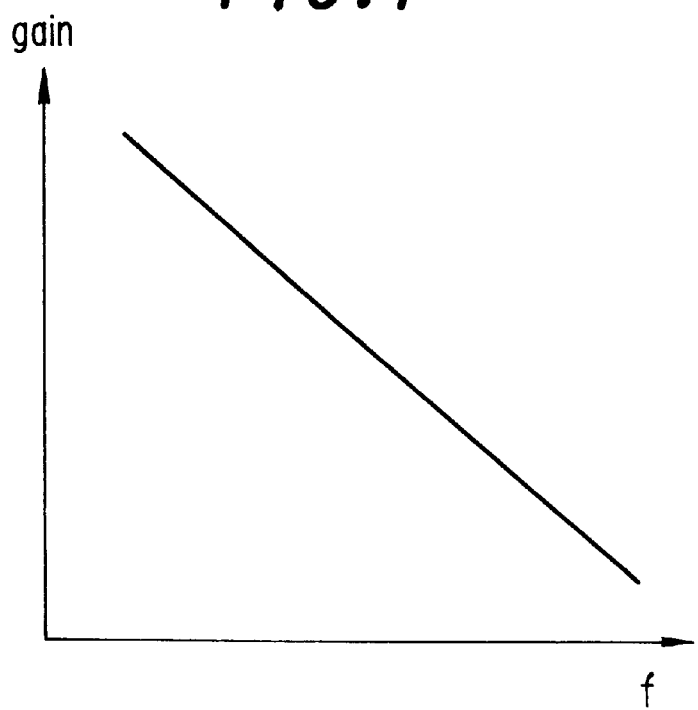

On the other hand, feedback loops having the delay elements 67, 68 constitute an integrator in the basic part. This integrator has a gain which steadily decreases in terms of frequency as shown in FIG. 7. Accordingly, the overall gain of the basic part is made substantially flat in terms of.frequency through the combination of the differentiator and the integrator. On the other hand, the quantization error E is generated only in the differentiator 65 so that the basic part of the single loop type has a specific noise distribution which is small in a lower frequency range and is great in a higher frequency range, thereby performing noise shaping operation.

This basic part of the single loop type is added with adders 61, 62 and a delay element 66 to thereby constitute the delta-sigma modulator of the double loop type shown in FIG. 5. The double loop modulator has an input/output performance represented by:

$$Y=X+(1-Z^{-1})^2E$$

The double loop type modulator operates basically in manner similar to the single loop type modulator. Since another integrator is added, the double loop type modulator can more intensively distribute quantization noise to a higher frequency range as compared to the single loop modulator.

What is claimed is:

1. A digital-to-analog conversion apparatus operative to convert a digital input into a corresponding analog output, comprising: oversampling means operative at a given oversampling rate for oversampling a digital input having a varying value represented in the form of multiple bits; modulating means having a given loop number K and operative to effect delta-sigma modulation of the oversampled digital input to reduce the number of the multiple bits for requantizing the oversampled digital input with a certain S/N ratio; converting means for converting the requantized digital input into an analog output; detecting means for detecting when the value of the digital input falls below a predetermined level; input increasing means disposed upstream of the modulating means and responsive to detected results of the detecting means for increasing the value of the digital input to improve the S/N ratio in the modulating means by reducing repuantizing error resulting from the repuantization of the digital input; and output decreasing means disposed downstream of the modulating means and responsive to the detected results for effecting a reciprocally decreasing compensation of the increased value of the digital input while substantially maintaining the improved S/N ratio to produce an analog output corresponding to the digital input to avoid the need for an increase in the oversampling rate and the loop number K.

2. A digital-to-analog conversion apparatus according to claim 1; wherein the input increasing means includes multiplying means for multiplying the value of the digital input by a given multiplier factor, and the output decreasing means includes attenuating means for attenuating the analog output by an inverse of the multiplier factor.

3. A digital-to-analog conversion apparatus according to claim 2; wherein the multiplying means comprises shifting means for bit-shifting the multiple bits of the digital input leftward by a given bit shift number according to the multiplier factor.

4. A digital-to-analog conversion apparatus according to claim 3; wherein the multiplying means further comprises setting means for setting an optimum bit shift number in response to the detected level of the digital input.

5. A digital-to-analog conversion apparatus according to claim 2; wherein the attenuating means comprises a ladder resistance network for attenuating the analog signal by an inverse of the multiplier factor.

6. A digital-to-analog conversion apparatus according to claim 2; wherein the attenuating means comprises a pulse-width-variable attenuator responsive to the requantized digital input for producing a corresponding pulse signal having a pulse width which is an inverse of the multiplier factor.

7. A digital-to-analog converter comprising: means operative at a given oversampling rate for oversampling a digital input having multiple bits; means having a given loop number K for delta-sigma modulating the oversampled digital input to reduce the number of bits for requantizing the oversampled digital input with a given S/N ratio; means for converting the requantized digital input into an analog signal; means for detecting when the value of the digital input is below a predetermined value; means disposed upstream of the delta-sigma modulating means for increasing the value of the digital input by a given factor when the value is below the predetermined value to improve the S/N ratio thereof in the delta-sigma modulating means by reducing reguantizing error resulting from the reguantization of the digital input; and means disposed downstream of the delta-sigma modulating means for compensating for the increase in value with a decrease in value by a reciprocal of the given factor while substantially maintaining the improved S/N ratio in the resulting analog signal to avoid the need for an increase in the oversampling rate and the loop number K.

8. A digital-to-analog converter according to claim 7; wherein the means for increasing comprises means for multiplying the value of the digital input by a given multiplier factor and the compensating means comprises means for attenuating the analog output by an inverse of the given multiplier factor.

9. A digital-to-analog converter according to claim 8; wherein the means for multiplying includes means for bit-shifting the multiple bits of the digital input leftward by a given bit shift number corresponding to the multiplier factor.

10. A digital-to-analog converter according to claim 9; wherein the means for multiplying comprises means for setting an optimum bit shift number in response to the detected level of the digital input.

11. A digital-to-analog converter according to claim 8; wherein the means for attenuating comprises a ladder resistance network for attenuating the analog signal by an inverse of the multiplier factor.

12. A digital-to-analog converter according to claim 8; wherein the means for attenuating comprises a pulse-width-variable attenuator responsive to the requantized digital input for producing a corresponding pulse signal having a pulse width which is an inverse of the multiplier factor.

13. A digital-to-analog converter comprising: an oversampling device operative at a given oversampling rate for oversampling a digital input; a delta-sigma modulating device having a given loop number K for delta-sigma modulating and requantizing the oversampled digital input signal; a converting device for converting the requantized digital input signal into a corresponding analog signal; a detecting device for detecting if the value of the digital input signal is below a predetermined value; an input increasing device for increasing by a given factor each level of the digital input signal that is below the predetermined value to improve a S/N ratio of the converted signal by reducing requantizing error resulting from the requantization of the digital input signal; and a compensating device for compensating for the increase in level of the digital input by reciprocally decreasing the level of the analog signal while substantially maintaining the improved S/N ratio of the delta-sigma modulating device to avoid the need for increasing the oversampling rate and the loop number K of the delta-sigma modulating device due to requantization of the digital input.

14. A digital-to-analog converter according to claim 13; wherein the input increasing device comprises means for multiplying the value of the digital input by a given multiplier and the compensating device comprises means for attenuating the analog output by the equivalent of an inverse of the given multiplier.

15. A digital-to-analog converter according to claim 14; wherein the means for multiplying comprises a shift register for shifting the multiple bits of the digital input leftward by a given number corresponding to the multiplier.

16. A digital-to-analog converter according to claim 15; wherein the means for multiplying further comprises means for setting an optimum bit shift number in response to the detected level of the digital input.

17. A digital-to-analog converter according to claim 14; wherein the means for attenuating comprises a ladder resistance network for attenuating the analog signal by an inverse of the multiplier.

18. A digital-to-analog converter according to claim 14; wherein the means for attenuating comprises a pulse-width-variable attenuator responsive to the requantized digital input for producing a corresponding pulse signal having a pulse width which is an inverse of the multiplier.

* * * * *